United States Patent
Morita et al.

(10) Patent No.: US 11,322,571 B2
(45) Date of Patent: May 3, 2022

(54) DISPLAY APPARATUS INCLUDING NEGATIVE ELECTRODE PADS AND POSITIVE ELECTRODE PADS THAT ARE INCLUDED IN FIRST INSPECTION PADS BUT NOT IN SECOND INSPECTION PADS

(71) Applicant: Japan Display Inc., Minato-ku (JP)

(72) Inventors: Tetsuo Morita, Minato-ku (JP); Hiroyuki Kimura, Minato-ku (JP); Makoto Shibusawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 149 days.

(21) Appl. No.: 16/781,009

(22) Filed: Feb. 4, 2020

(65) Prior Publication Data

US 2020/0176546 A1 Jun. 4, 2020

Related U.S. Application Data

(63) Continuation of application No. PCT/JP2018/021988, filed on Jun. 8, 2018.

(30) Foreign Application Priority Data

Sep. 7, 2017 (JP) .............................. JP2017-171933

(51) Int. Cl.
*H01L 27/32* (2006.01)
*H01L 21/66* (2006.01)
(Continued)

(52) U.S. Cl.
CPC .......... *H01L 27/3276* (2013.01); *H01L 22/32* (2013.01); *H01L 51/0031* (2013.01);
(Continued)

(58) Field of Classification Search
CPC . H01L 27/3276; H01L 22/32; H01L 51/0031; H01L 2251/566; H01L 2251/568;
(Continued)

(56) References Cited

U.S. PATENT DOCUMENTS

2006/0017373 A1* 1/2006 Lee ...................... H01L 27/3288
313/500
2008/0303755 A1* 12/2008 Oh ....................... H01L 27/3288
345/76
2015/0282259 A1 10/2015 Yamada et al.

FOREIGN PATENT DOCUMENTS

CN 101320736 A 12/2008
JP 2008-304880 A 12/2008
(Continued)

OTHER PUBLICATIONS

International Search Report dated Aug. 26, 2018 in PCT/JP2018/021988 filed on Jun. 8, 2018, 2 pages.
(Continued)

*Primary Examiner* — Ermias T Woldegeorgis
(74) *Attorney, Agent, or Firm* — Oblon, McClelland, Maier & Neustadt, L.L.P.

(57) ABSTRACT

A multi-piece substrate integrally having a plurality of product regions each provided with a light-emitting element driven by a current and a blank region adjacent to each of the plurality of product regions is prepared. The current is passed through a cathode pad and an anode pad to inspect the light-emitting element. A plurality of display panels are cut out from the multi-piece substrate so as to respectively correspond to the plurality of product regions. The multi-piece substrate includes a plurality of first test pads disposed in each of the plurality of product regions for inspecting the light-emitting element, and a plurality of second test pads disposed in the blank region for inspecting the light-emitting element. The cathode pad and the anode pad are included in the plurality of first test pads and are not included in the plurality of second test pads.

8 Claims, 4 Drawing Sheets

(51) Int. Cl.
  *H01L 51/00* (2006.01)
  *H05B 33/02* (2006.01)
  *G09F 9/00* (2006.01)
  *H05B 33/12* (2006.01)
  *G09F 9/30* (2006.01)
  *H05B 33/10* (2006.01)
  *H05K 3/00* (2006.01)

(52) U.S. Cl.
  CPC .................. *G09F 9/00* (2013.01); *G09F 9/30* (2013.01); *H01L 2251/566* (2013.01); *H01L 2251/568* (2013.01); *H05B 33/02* (2013.01); *H05B 33/10* (2013.01); *H05B 33/12* (2013.01); *H05K 3/00* (2013.01)

(58) Field of Classification Search
  CPC ........ H05B 33/02; H05B 33/06; H05B 33/10; H05B 33/12; H05K 3/00; G09G 3/006; G09F 9/00; G09F 9/30
  See application file for complete search history.

(56) References Cited

FOREIGN PATENT DOCUMENTS

| | | |
|---|---|---|
| JP | 2010-139962 A | 6/2010 |
| JP | 2015-191700 A | 11/2015 |
| KR | 10-0637065 B1 | 10/2006 |

OTHER PUBLICATIONS

Chinese Office Action dated Mar. 24, 2021 in Chinese Patent Application No. 201880051690.X (with English machine translation), 16 pages.

Office Action dated Nov. 9, 2021, in Japanese Patent Application No. 2017-171933 w/English-language Translation.

* cited by examiner

DISPLAY APPARATUS INCLUDING NEGATIVE ELECTRODE PADS AND POSITIVE ELECTRODE PADS THAT ARE INCLUDED IN FIRST INSPECTION PADS BUT NOT IN SECOND INSPECTION PADS

CROSS-REFERENCE TO RELATED APPLICATION

This application is a continuation application of International Application PCT/JP2018/021988 filed on Jun. 8, 2018, which claims priority from Japanese patent application JP2017-171933 filed on Sep. 7, 2017. The contents of these applications are incorporated herein by reference in their entirety.

BACKGROUND

1. Field

The present invention relates to a method for manufacturing a display device and a multi-piece substrate.

2. Description of the Related Art

It is known that a plurality of display panels are integrally manufactured by using a multi-piece substrate, and then individual display panels are cut out (JP 2015-191700 A). In such a multi-piece manufacturing process, cell inspection is performed before cutting into individual display panels. Test pads for cell inspection are disposed in a peripheral region outside a display area for each display panel.

In recent years, the peripheral region tends to become narrower in order to enlarge the display area, and there is no space to dispose the test pads in the peripheral region. Therefore, in a multi-piece substrate, the test pads are often disposed outside a product region.

When a light-emitting element is driven by a current as in an organic electroluminescence display device, if the test pad for supplying the current is outside the product region, the wiring becomes long. Alternatively, the wiring may be thinned at a portion intersecting with a cutting line so that cutting can be easily performed. Therefore, an accurate inspection cannot be performed due to a voltage drop, or the light-emitting element may be affected by heat generation.

SUMMARY

An object of the present invention is to efficiently dispose test pads in a constrained space.

According to an aspect of the present invention, there is provided a method for manufacturing a display device including a step of preparing a multi-piece substrate integrally having a plurality of product regions each provided with a light-emitting element driven by a current and a blank region adjacent to each of the plurality of product regions, a step of inspecting the light-emitting element by passing the current through a cathode pad and an anode pad, and a step of cutting out a plurality of display panels so as to respectively correspond to the plurality of product regions from the multi-piece substrate, in which the multi-piece substrate includes a plurality of first test pads disposed in each of the plurality of product regions for inspecting the light-emitting element, and a plurality of second test pads disposed in the blank region for inspecting the light-emitting element, and the cathode pad and the anode pad are included in the plurality of first test pads and are not included in the plurality of second test pads.

According to the present invention, it is possible to efficiently dispose the test pads in a constrained space by disposing the cathode pad and the anode pad for passing a current in the product region.

According to another aspect of the present invention, there is provided a multi-piece substrate including a light-emitting element provided so as to be driven by a current in each of a plurality of product regions for being cut out into a plurality of display panels, a plurality of first test pads disposed in each of the plurality of product regions in order to inspect the light-emitting element, and a plurality of second test pads disposed in a blank region adjacent to each of the plurality of product regions in order to inspect the light-emitting element, in which the plurality of first test pads include a cathode pad and an anode pad for passing the current, and the plurality of second test pads do not include a pad for passing the current.

According to the present invention, it is possible to efficiently dispose the test pads in a constrained space by disposing the cathode pad and the anode pad for passing a current in the product region.

DETAILED DESCRIPTION

Figure 1:
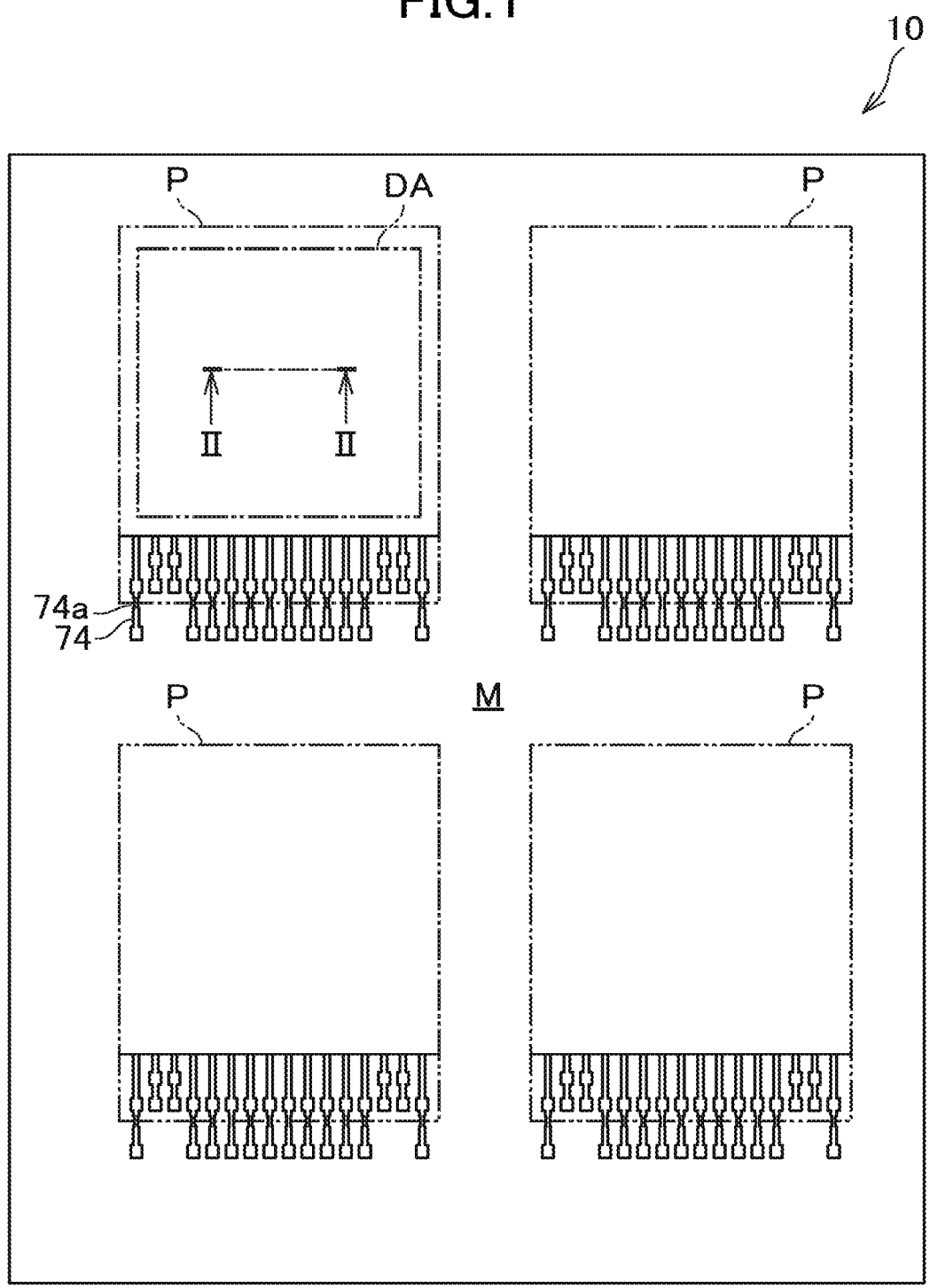
FIG. 1 is a plan view of a multi-piece substrate according to an embodiment of the present invention.

Embodiments of the present invention will be described below with reference to drawings. However, the present invention can be implemented in various modes without departing from the gist thereof, and is not construed as being limited to the description of the embodiments exemplified below.

In order to make the description clearer, the drawings may schematically represent the width, thickness, shape of each part, as compared with an actual mode, but are merely examples and do not limit the interpretation of the present invention. In the present specification and each drawing, elements having the same functions as those described with reference to the previous drawings may be denoted by the same reference numerals, and redundant description may be omitted.

In the detailed description of the present invention, when defining the positional relationship between one component and another component, "upper" and "below" include not only the case of being positioned immediately above or immediately below the one component, but also the case of interposing another component in between, unless otherwise specified.

FIG. 1 is a plan view of a multi-piece substrate according to an embodiment of the present invention. A multi-piece substrate 10 has a plurality of product regions P. The product region P is a region for being cut out into a display panel. The display panel is an organic electroluminescence panel, and combines a plurality of color unit pixels (subpixels) of red, green, and blue to form full-color pixels, and displays a full-color image in a display area DA, for example. The multi-piece substrate 10 has a blank region M adjacent to each of the plurality of product regions P.

Figure 2:
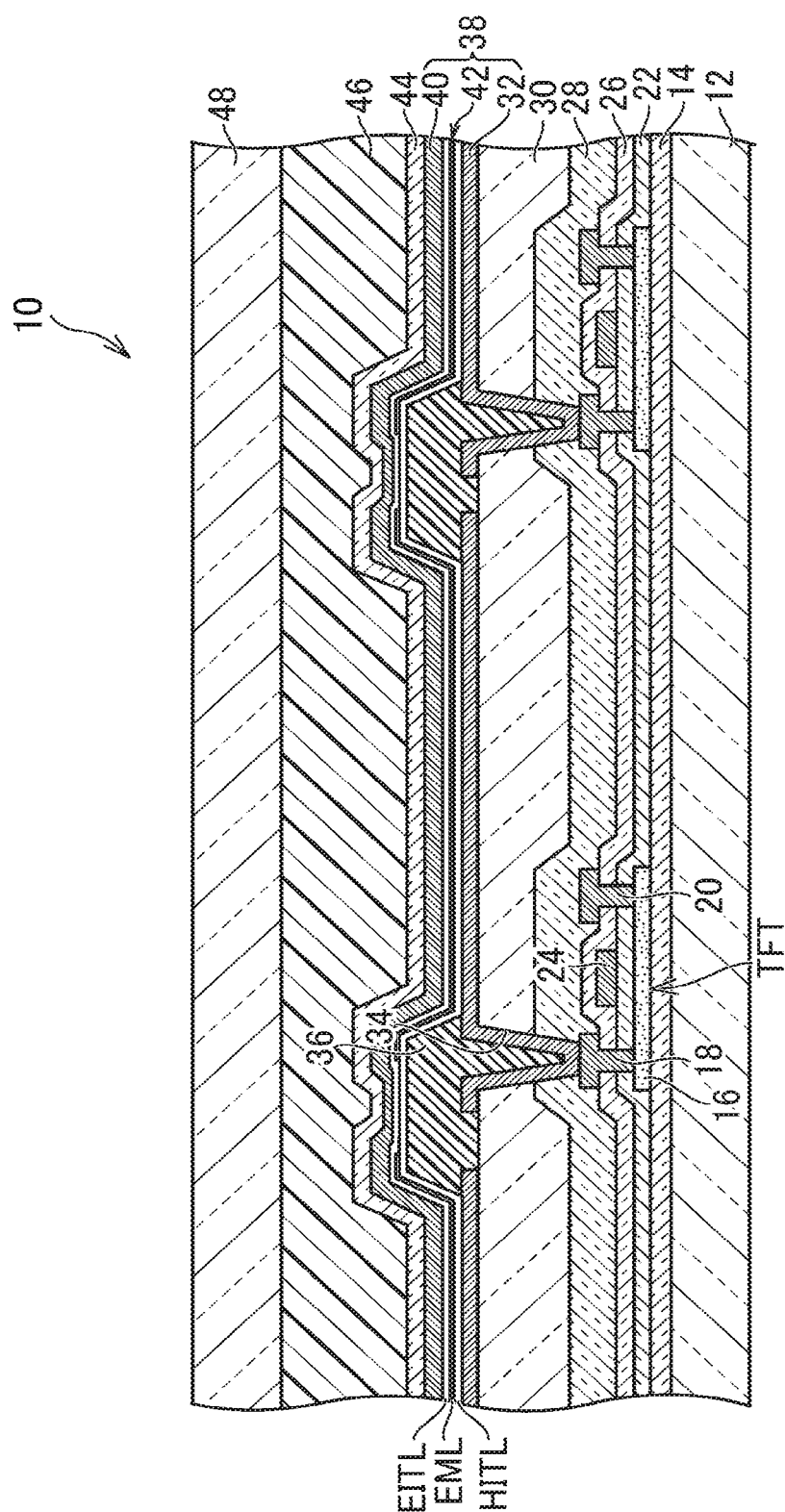
FIG. 2 is an enlarged view of a cross section taken along the line II-II of the multi-piece substrate shown in FIG. 1.

FIG. 2 is an enlarged view of a cross section taken along the line II-II of the multi-piece substrate 10 shown in FIG. 1. The multi-piece substrate 10 has a substrate 12. An undercoat layer 14 serving as a barrier against impurities is formed on the substrate 12, and a semiconductor layer 16 is formed on the undercoat layer. A source electrode 18 and a drain electrode 20 are electrically connected to the semiconductor layer 16, and a gate insulating film 22 is formed to cover the semiconductor layer 16. A gate electrode 24 is formed on the gate insulating film 22, and an interlayer insulating film 26 is formed to cover the gate electrode 24. The source electrode 18 and the drain electrode 20 penetrate the gate insulating film 22 and the interlayer insulating film 26. At least a part of a thin film transistor TFT includes the semiconductor layer 16, the source electrode 18, the drain electrode 20, and the gate electrode 24. A passivation film 28 is provided so as to cover the thin film transistor TFT.

A planarization layer 30 is provided on the passivation film 28. A plurality of pixel electrodes 32 (for example, anodes) configured to respectively correspond to a plurality of unit pixels are provided on the planarization layer 30. The planarization layer 30 is formed so that at least the surface on which the pixel electrode 32 is provided is flat. The pixel electrode 32 is electrically connected to one of the source electrode 18 and the drain electrode 20 on the semiconductor layer 16 through a contact hole 34 that penetrates the planarization layer 30 and the passivation film 28.

An insulating layer 36 is formed on the planarization layer 30 and the pixel electrode 32. The insulating layer 36 is placed on the peripheral edge of the pixel electrode 32 and formed so as to open a part (for example, the center) of the pixel electrode 32. A bank surrounding a part of the pixel electrode 32 is formed by the insulating layer 36. The pixel electrode 32 is a part of a light-emitting element 38. The light-emitting element 38 includes a counter electrode 40 (for example, a cathode) facing the plurality of pixel electrodes 32 and an organic electroluminescence layer 42.

The organic electroluminescence layer 42 includes a light-emitting layer EML. The light-emitting layer EML is provided independently (separately) for each pixel electrode 32 and is also placed on the insulating layer 36. In this case, the light-emitting layer EML emits light in blue, red, or green corresponding to each pixel. The color corresponding to each pixel is not limited thereto, and may be yellow or white, for example. The light-emitting layer EML is formed by vapor deposition, for example. Alternatively, the light-emitting layer EML may be formed so as to extend over a plurality of pixels on the entire surface covering the display area DA shown in FIG. 1. That is, the light-emitting layer EML may be formed continuously on the insulating layer 36. In this case, the light-emitting layer EML is formed by coating by solvent dispersion. When the light-emitting layer EML is formed so as to extend over a plurality of pixels, all the subpixels emit white light, and a desired color wavelength portion is extracted through a color filter (not shown).

Between the pixel electrode 32 and the light-emitting layer EML, a hole injection/transport layer HITL composed of at least one of a hole injection layer and a hole transport layer is interposed. The hole injection/transport layer HITL may be provided separately for each pixel electrode 32, but in the example of FIG. 2, the hole injection/transport layer HITL is continuous over the entire display area DA (see FIG. 1). The hole injection/transport layer HITL is in contact with the pixel electrode 32 and the insulating layer 36.

An electron injection/transport layer EITL composed of at least one of an electron injection layer and an electron transport layer is interposed between the counter electrode 40 and the light-emitting layer EML. The electron injection/transport layer EITL may be provided separately for each pixel electrode 32, but in the example of FIG. 2, the electron injection/transport layer EITL is continuous over the entire display area DA. The electron injection/transport layer EITL is in contact with the counter electrode 40.

The light-emitting layer EML is sandwiched between the pixel electrode 32 and the counter electrode 40, and emits light with brightness controlled by a current flowing therebetween. In the product region P, the light-emitting element 38 is provided so as to be driven by a current. The counter electrode 40 is made of a metal thin film or the like and has optical transparency, and displays an image by transmitting the light generated in the light-emitting layer EML. The pixel electrode 32 is made of a reflective film that reflects the light generated in the light-emitting layer EML in the direction of the counter electrode 40, and one of a plurality of layers may be a reflective film.

The organic electroluminescence layer 42 is sealed by a sealing film 44 and shielded from moisture. The sealing film 44 may have a structure in which an inorganic layer made of an inorganic layer material such as silicon nitride is included, and a pair of inorganic layers sandwiches an organic layer. A counter substrate 48 is attached to the sealing film 44 via an adhesive layer 46.

Figure 3:
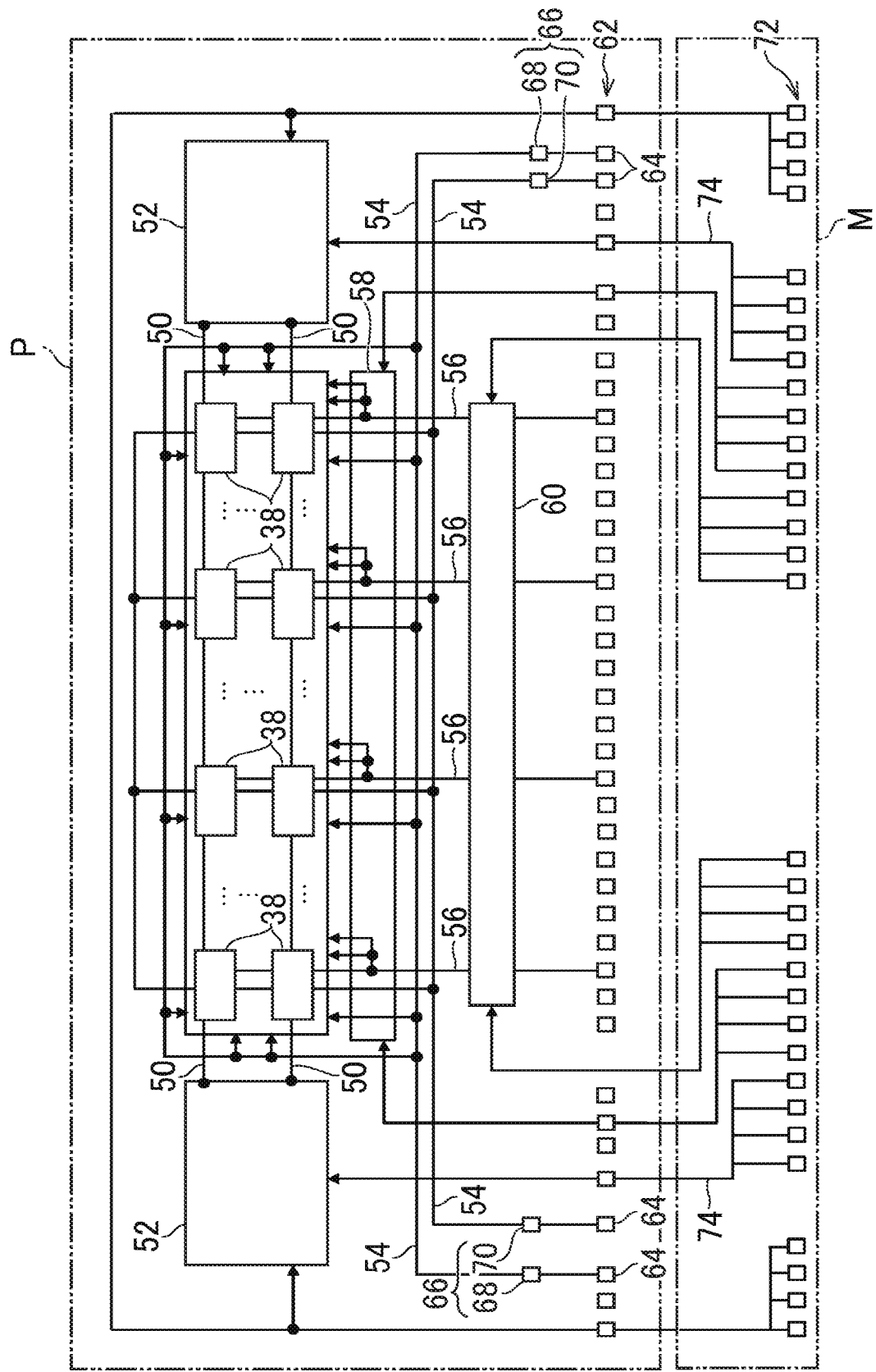
FIG. 3 is a view showing a circuit in a product region.

FIG. 3 is a diagram showing a circuit in the product region P. A plurality of light-emitting elements 38 for generating an image are driven for each scanning line 50 by a line sequential scanning method. A plurality of the scanning lines 50 are drawn out from a scanning circuit 52. A power supply line 54 (cathode line and anode line) for supplying a current is connected to the light-emitting element 38. A signal line 56 is connected to the light-emitting element 38 in order to input an image signal for controlling the current. A signal line selection circuit 58 for selecting any of a plurality of signal lines 56 is provided, and a cell test circuit 60 for inspecting all the light-emitting elements 38 at a time is provided.

In the product region P, a plurality of product pads 62 are disposed. The product pad 62 is used in a cut-out display panel. The plurality of product pads 62 include a pad for supplying power to the scanning circuit 52, a pad for inputting a control signal to the scanning circuit 52, a pad for inputting a control signal to the signal line selection circuit 58, and the like. The plurality of product pads 62 include power supply pad 64 (product cathode pad and product anode pad) connected to the power supply line 54 for supplying a current to the light-emitting element 38.

In the product region P, a plurality of first test pads 66 are disposed in order to inspect the light-emitting element 38. The plurality of first test pads 66 include a cathode pad 68 and an anode pad 70 for passing a current through the light-emitting element 38. The cathode pad 68 and the anode pad 70 are connected to the power supply pad 64 (product cathode pad and product anode pad), respectively. The plurality of first test pads 66 are located closer to the plurality of light-emitting elements 38 than the plurality of product pads 62.

In the blank region M, a plurality of second test pads 72 are disposed corresponding to each product region P in order to inspect the light-emitting element 38. The plurality of second test pads 72 include a pad for supplying power to the scanning circuit 52, a pad for inputting a control signal to the scanning circuit 52, a pad for inputting a control signal to the signal line selection circuit 58, a pad for inputting a control signal to the cell inspection circuit 60, and the like. The plurality of second test pads 72 do not include a pad for passing a current for causing the light-emitting element 38 to emit light.

According to the present embodiment, it is possible to efficiently dispose the test pads in a constrained space by disposing the cathode pad 68 and the anode pad 70 for passing a current through the light-emitting element 38 in the product region P.

In the method for manufacturing a display device according to the present embodiment, the multi-piece substrate 10 is prepared as shown in FIG. 1. The current is passed through the cathode pad 68 and the anode pad 70 to inspect the light-emitting element 38. A plurality of display panels are cut out from the multi-piece substrate 10 so as to correspond to the plurality of product regions P, respectively. A wiring 74 connected to the plurality of second test pads 72 has a narrow portion 74a that is narrowed on the cutting line so as to be easily cut (see FIG. 1).

Figure 4:
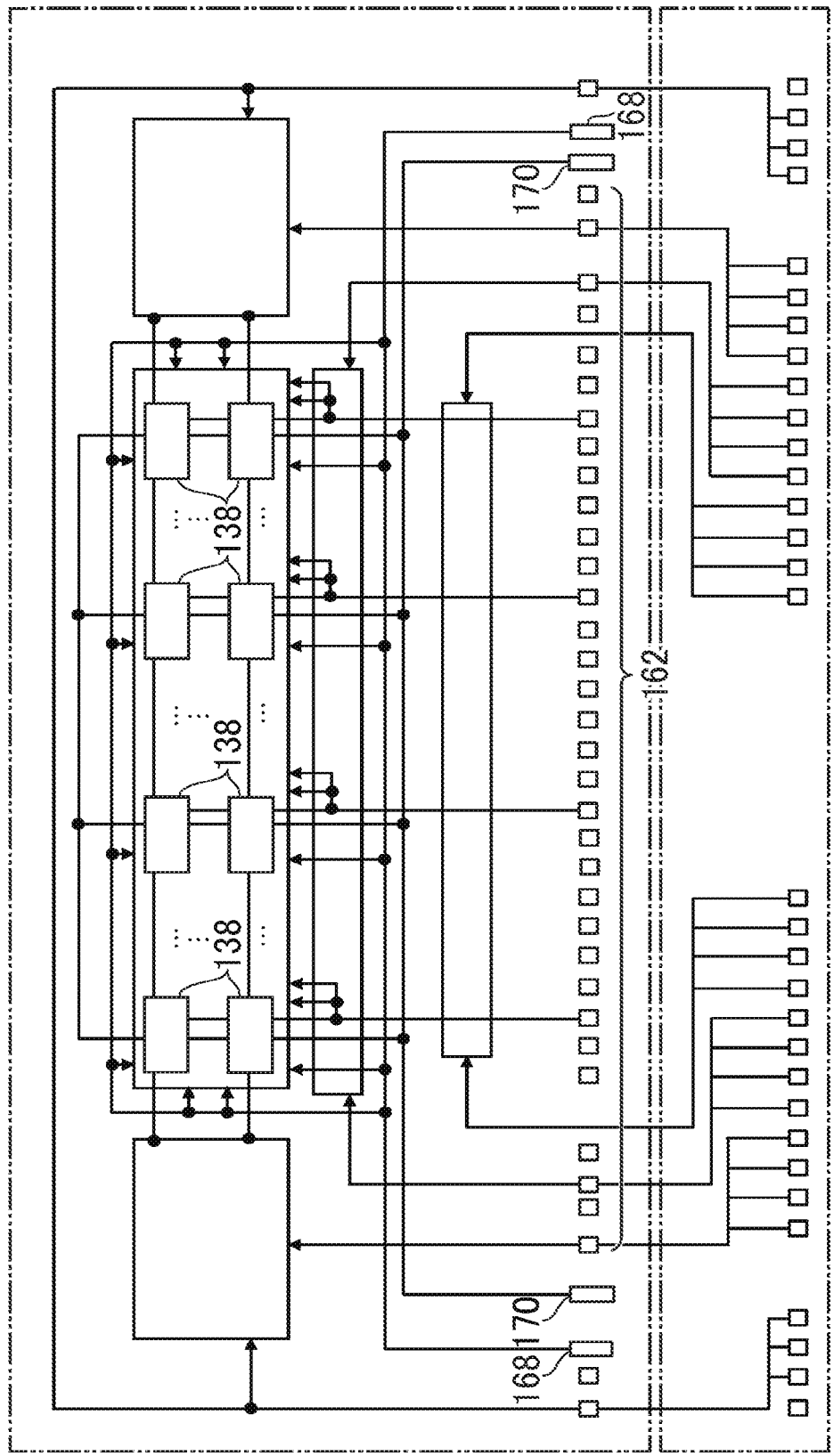
FIG. 4 is a view showing a circuit in a product region according to a modification example of the embodiment of the present invention.

FIG. 4 is a diagram showing a circuit in the product region P according to a modification example of the embodiment of the present invention. In this example, a cathode pad 168 and an anode pad 170 are used not only for inspecting a light-emitting element 138 but also for the product. That is, the cathode pad 168 and the anode pad 170 are also used for passing a current through the light-emitting element 138 in each of the plurality of cut-out display panels.

In the product region P, a plurality of product pads 162 for use in each of the plurality of cut-out display panels for a purpose other than passing a current through the light-emitting element 138 are disposed. Compared with the product pad 162, the cathode pad 168 and the anode pad 170 have a larger area or a wider interval between adjacent pads. By doing so, it is easy to apply a test probe to the cathode pad 168 and the anode pad 170. The method for manufacturing a display device according to the present embodiment corresponds to the content that is obvious from the description regarding the structure and the content described in the embodiment.

The display device is not limited to an organic electroluminescence display device, and may be a display device in which each pixel is provided with a light-emitting element such as a quantum-dot light emitting diode (QLED).

While there have been described what are at present considered to be certain embodiments, it will be understood that various modifications may be made thereto, and it is intended that the appended claims cover all such modifications as fall within the true spirit and scope of the invention.

What is claimed is:

1. A method for manufacturing a display device, the method comprising:
   a step of preparing a multi-piece substrate integrally having a plurality of product regions each provided with a light-emitting element driven by a current and a blank region adjacent to each of the plurality of product regions;
   a step of inspecting the light-emitting element by passing the current through a cathode pad and an anode pad; and
   a step of cutting out a plurality of display panels so as to respectively correspond to the plurality of product regions from the multi-piece substrate, wherein
   the multi-piece substrate includes a plurality of first test pads disposed in each of the plurality of product regions for inspecting the light-emitting element, and a plurality of second test pads disposed in the blank region for inspecting the light-emitting element, and
   the cathode pad and the anode pad are included in the plurality of first test pads and are not included in the plurality of second test pads.

2. The method for manufacturing a display device according to claim 1, wherein
   the cathode pad and the anode pad are also used for passing the current through the light-emitting element in each of the plurality of cut-out display panels.

3. The method for manufacturing a display device according to claim 2, wherein
   the multi-piece substrate further includes a plurality of product pads for use in each of the plurality of cut-out display panels for a purpose other than passing the current through the light-emitting element, in each of the plurality of product regions.

4. The method for manufacturing a display device according to claim 1, wherein
   the multi-piece substrate further includes a plurality of product pads for use in each of the plurality of cut-out display panels, in each of the plurality of product regions.

5. A multi-piece substrate comprising:
   a light-emitting element provided so as to be driven by a current in each of a plurality of product regions for being cut out into a plurality of display panels;
   a plurality of first test pads disposed in each of the plurality of product regions in order to inspect the light-emitting element; and
   a plurality of second test pads disposed in a blank region adjacent to each of the plurality of product regions in order to inspect the light-emitting element, wherein
   the plurality of first test pads include a cathode pad and an anode pad for passing the current, and
   the plurality of second test pads do not include a pad for passing the current.

6. The multi-piece substrate according to claim 5, wherein
   the cathode pad and the anode pad are also used for passing the current through the light-emitting element in each of the plurality of cut-out display panels.

7. The multi-piece substrate according to claim 6, further comprising:
   a plurality of product pads for use in each of the plurality of cut-out display panels for a purpose other than passing the current through the light-emitting element in each of the plurality of product regions.

8. The multi-piece substrate according to claim 5, further comprising:
   a plurality of product pads for use in each of the plurality of cut-out display panels, in each of the plurality of product regions.

* * * * *